(12) United States Patent
Li et al.

(10) Patent No.: US 9,577,031 B2
(45) Date of Patent: Feb. 21, 2017

(54) SEMICONDUCTOR STRUCTURE AND METHOD FOR FORMING THE SAME

(76) Inventors: Yuan Li, Beijing (CN); Lei Guo, Beijing (CN)

( * ) Notice: Subject to any disclaimer, the term of this patent is extended or adjusted under 35 U.S.C. 154(b) by 357 days.

(21) Appl. No.: 14/362,075

(22) PCT Filed: Jul. 12, 2012

(86) PCT No.: PCT/CN2012/078571
§ 371 (c)(1),
(2), (4) Date: May 30, 2014

(87) PCT Pub. No.: WO2013/078867
PCT Pub. Date: Jun. 6, 2013

(65) Prior Publication Data
US 2014/0332933 A1    Nov. 13, 2014

(30) Foreign Application Priority Data
Nov. 30, 2011    (CN) .......................... 2011 1 0391133

(51) Int. Cl.
*H01L 29/04*    (2006.01)
*H01L 33/16*    (2010.01)
(Continued)

(52) U.S. Cl.
CPC ......... *H01L 29/045* (2013.01); *H01L 21/0275* (2013.01); *H01L 29/0692* (2013.01); *H01L 33/16* (2013.01); *H01L 33/20* (2013.01); *H01L 33/32* (2013.01); *H01L 21/0242* (2013.01); *H01L 21/0243* (2013.01); *H01L 21/02381* (2013.01); *H01L 21/02433* (2013.01); *H01L 21/02609* (2013.01); *H01L 21/02658* (2013.01); *H01L 29/04* (2013.01); *H01L 33/007* (2013.01); *H01L 33/24* (2013.01)

(58) Field of Classification Search
CPC ............ H01L 21/0242; H01L 21/0243; H01L 21/02433; H01L 33/24; H01L 21/02658; H01L 21/02609; H01L 29/04
USPC ......................................................... 257/627
See application file for complete search history.

(56) References Cited

FOREIGN PATENT DOCUMENTS

| CN | 1992359 A | 7/2007 |
|---|---|---|
| CN | 101677118 A | 3/2010 |

(Continued)

OTHER PUBLICATIONS

English language abstract for JP2003267756A extracted from espacenet.com on Aug. 9, 2014, 1 page.
(Continued)

*Primary Examiner* — Marc Armand
*Assistant Examiner* — Tifney Skyles
(74) *Attorney, Agent, or Firm* — Howard & Howard Attorneys PLLC

(57) ABSTRACT

A semiconductor structure and a method for forming the same are provided. The semiconductor structure comprises: a substrate; and a plurality of convex structures formed on a surface of the substrate and arranged in a longitudinal direction of the substrate, each convex structure having a top surface, a bottom surface located on the surface of the substrate, a first end surface and a second end surface parallel to each other, and a front side surface and a rear side surface parallel to each other, in which the rear side surface of one of two adjacent convex structures and the front side surface of the other are located on a same plane to allow the plurality of convex structures to form a zigzag structure.

20 Claims, 3 Drawing Sheets

(51) Int. Cl.
*H01L 33/32* (2010.01)
*H01L 21/027* (2006.01)
*H01L 29/06* (2006.01)
*H01L 33/20* (2010.01)
H01L 33/24 (2010.01)
H01L 21/02 (2006.01)
H01L 33/00 (2010.01)

(56) References Cited

FOREIGN PATENT DOCUMENTS

| | | |
|---|---|---|
| CN | 102437264 A | 5/2012 |
| EP | 1775355 A2 | 4/2007 |
| JP | 2003267756 A | 9/2003 |

OTHER PUBLICATIONS

English language abstract for CN1992359A extracted from espacenet.com on Aug. 9, 2014, 2 pages.
English language abstract for CN101677118A extracted from espacenet.com on Aug. 9, 2014, 1 page.
English language abstract for CN102437264A extracted from espacenet.com on Aug. 9, 2014, 2 pages.
International Search Report of WO2013078867A1 dated Aug. 27, 2012, 3 pages.

SEMICONDUCTOR STRUCTURE AND METHOD FOR FORMING THE SAME

CROSS-REFERENCE TO RELATED APPLICATIONS

This application is the National Stage of International Patent Application No. PCT/CN2012/078571, filed on Jul. 12, 2012, which claims priority to and all the benefits of Chinese Patent Application No. 201110391133.2, filed on Nov. 30, 2011, the content of which is incorporated herein by reference.

FIELD

The present disclosure relates to semiconductor design and fabrication field, and more particularly to a semiconductor structure and a method for forming the same.

BACKGROUND

A GaN crystal material is primarily used in conventional blue light and white light light-emitting diode (LED) products. A common technology for fabricating a light emitting layer is an epitaxial growth of the (0001) GaN crystal on a (0001) sapphire crystal or a (111) silicon substrate. Because the crystal plane (0001) (perpendicular to a c axis) of the GaN crystal is polar, according to common LED device structures, a polarity of a material may greatly reduce a quantum efficiency of the light emitting layer, thus greatly reducing a light emitting efficiency. Therefore, the quantum efficiency may be greatly raised by using a GaN LED device of a non-polar plane. However, a dislocation density of a GaN film, which has a non-polar a-plane or m-plane and is formed on the sapphire or silicon substrate by epitaxy, is a few orders of magnitude higher than that of the conventional (0001) GaN crystal because of factors such as lattice mismatch, so that it is difficult to apply the GaN LED device of the non-polar plane in a large scale production.

In addition, in a fabrication technology of a semiconductor device, it is generally needed to fabricate a specific crystal plane on a substrate to form a special three-dimensional structure. By coating a photoresist on a wafer substrate, transferring a planar pattern onto a photoresist mask by lithography, and then etching, a required structure such as a recess or a trench may be obtained with a conventional micro-fabrication technology. However, some special three-dimensional structures cannot be fabricated by the technology based on the planar process, and only some extremely special crystal planes, such as (111) of silicon, may be obtained by using an anisotropy characteristic of a wet etching. However, some crystal planes, such as (337), (5 5 12), (113), or (211) of silicon, cannot be fabricated on arbitrary orientation substrate.

SUMMARY

The present disclosure is aimed to solve at least one of the problems, particularly to solve a problem of a reduction of a light emitting efficiency caused by the fact that a polar material is used to fabricate a light emitting layer of an active region of a LED epitaxial wafer. Accordingly, a semiconductor structure is provided, in which a plurality of discrete planes at a determinate angle to an original surface of a substrate are formed on the substrate. The discrete plane is suitable for epitaxial growth and serves as an epitaxial growth plane in subsequent processes. A non-polar or semi-polar LED device fabricated on the semiconductor structure may solve the above problem of the reduction of the light emitting efficiency. Further, a method for forming arbitrary crystal plane surface on the substrate to fabricate a special three-dimensional structure is also provided.

According to a first aspect of the present disclosure, a semiconductor structure is provided. The semiconductor structure comprises: a substrate; and a plurality of convex structures formed on a surface of the substrate and arranged in a longitudinal direction of the substrate, each convex structure having a top surface, a bottom surface located on the surface of the substrate, a first end surface and a second end surface parallel to each other, and a front side surface and a rear side surface parallel to each other, in which each of the first end surface and the rear side surface of each convex structure has a shape of a triangle, each of the second end surface and the front side surface of each convex structure has a shape of a trapezium, each of the top surface and the bottom surface of each convex structure has a shape of a quadrangle, each of an intersection line between the second end surface and the rear side surface of each convex structure and an intersection line between the first end surface and the front side surface of the each convex structure is shorter than an intersection line between the second end surface and the front side surface of the each convex structure, top surfaces of the plurality of convex structures are parallel to each other, front side surfaces of the plurality of convex structures are parallel to each other, and the rear side surface of one of two adjacent convex structures and the front side surface of the other are located on a same plane to allow the plurality of convex structures to form a zigzag structure on the surface of the substrate.

In one embodiment, the plurality of convex structures comprise a plurality of first convex structures and a plurality of second convex structures, the plurality of first convex structures and the plurality of second convex structures are arranged into a first row and a second row in the longitudinal direction of the substrate respectively, each second convex structure corresponds to each first convex structure in a transverse direction of the substrate, and the first end surface of each second convex structure and the second end surface of a corresponding first convex structure are located on a same plane. Moreover, the plurality of first convex structures and the plurality of second convex structures are arranged in an array on the surface of the substrate.

In one embodiment, materials of each convex structure and the substrate are identical.

In one embodiment, each convex structure has a porous structure.

In one embodiment, the top surface and/or the front side surface of each convex structure is a plane formed by annealing in an atmosphere containing hydrogen.

In one embodiment, each convex structure is formed by a nanoimprint lithography process. In one embodiment, the substrate is a silicon substrate; the surface of the substrate is any crystal plane of {110}, {111}, {001}, {211}, {311}, {337} and {5 5 12} families of planes; and the top surface of each convex structure is any crystal plane of {111} and {110} families of planes, which is suitable epitaxial growth planes for GaN on silicon substrate, so as to allow the semiconductor structure to be suitable for fabricating the light emitting layer of the active region of the LED epitaxial wafer.

In one embodiment, the substrate is a sapphire substrate; and the surface of the substrate is any crystal plane of {1 $\bar{1}$02}, {11$\bar{2}$3}, {10$\bar{1}$0} and {11$\bar{2}$1} families of planes, and the top surface of each convex structure is a crystal plane (0001); or the surface of the substrate is any crystal plane of {10$\bar{1}$0} and {11$\bar{2}$0} families of planes, and the top surface of each convex structure is any crystal plane of {1$\bar{1}$02}, {11$\bar{2}$3}, {10$\bar{1}$0} and {11$\bar{2}$1} families of planes, so as to allow the semiconductor structure to be suitable for fabricating the light emitting layer of the active region of the LED epitaxial wafer.

According to a second aspect of the present disclosure, a method for forming the semiconductor structure is provided. The method comprises: providing a mold having a pattern matched with the zigzag structure of the semiconductor structure; providing a substrate and forming a photosensitive or thermosensitive material layer on the substrate; pressing the mold onto the photosensitive or thermosensitive material layer to fill the photosensitive or thermosensitive material layer into the pattern of the mold; curing the photosensitive or thermosensitive material layer by irradiating or heating to form a patterned mask layer on the substrate; and etching the patterned mask layer and the substrate to transfer the pattern and to form the zigzag structure on the substrate.

In one embodiment, after forming the zigzag structure, the method further comprises: anodizing each convex structure to form the porous structure; and annealing the porous structure in the atmosphere containing hydrogen to form a plane on the top surface and/or the front side surface of each convex structure.

In one embodiment, the substrate is a silicon substrate; the surface of the substrate is any crystal plane of {110}, {111}, {001}, {211}, {311}, {337} and {5 5 12} families of planes; and the top surface of each convex structure is any crystal plane of {111} and {110} families of planes, which is suitable epitaxial growth planes for GaN on silicon substrate, so as to allow the semiconductor structure to be suitable for fabricating the light emitting layer of the active region of the LED epitaxial wafer.

In one embodiment, the substrate is a sapphire substrate; and the surface of the substrate is any crystal plane of {1$\bar{1}$02}, {11$\bar{2}$3}, {10$\bar{1}$0} and {11$\bar{2}$1} families of planes, and the top surface of each convex structure is a crystal plane (0001); or the surface of the substrate is any crystal plane of {10$\bar{1}$0}, and {11$\bar{2}$0} families of planes, and the top surface of each convex structure is any crystal plane of {1$\bar{1}$02}, {11$\bar{2}$3}, {10$\bar{1}$0} and {11$\bar{2}$1} families of planes, so as to allow the semiconductor structure to be suitable for fabricating the light emitting layer of the active region of the LED epitaxial wafer.

According to a third aspect of the present disclosure, a method for forming the semiconductor structure is provided. The method comprises: providing a mold having a pattern matched with the zigzag structure of the semiconductor structure; providing a substrate and forming a thermoplastic material layer on the substrate; heating the thermoplastic material layer to a temperature above a glass transition temperature of the thermoplastic material, and pressing the mold onto the thermoplastic material layer to fill the thermoplastic material layer into the pattern of the mold; curing the thermoplastic material layer by reducing the temperature and then removing the mold to form a patterned mask layer on the substrate; and etching the patterned mask layer and the substrate to transfer the pattern and to form the zigzag structure on the substrate.

In one embodiment, after forming the zigzag structure, the method further comprises: anodizing each convex structure to form the porous structure; and annealing the porous structure in the atmosphere containing hydrogen to form a plane on the top surface and/or the front side surface of each convex structure.

In one embodiment, the substrate is a silicon substrate; the surface of the substrate is any crystal plane of {110}, {111}, {001}, {211}, {311}, {337} and {5 5 12} families of planes; and the top surface of each convex structure is any crystal plane of {111} and {110} families of planes, so as to allow the semiconductor structure to be suitable for fabricating the light emitting layer of the active region of the LED epitaxial wafer.

In one embodiment, the substrate is a sapphire substrate; and the surface of the substrate is any crystal plane of {1$\bar{1}$02}, {11$\bar{2}$3}, {10$\bar{1}$0} and {11$\bar{2}$1} families of planes, and the top surface of each convex structure is a crystal plane (0001); or the surface of the substrate is any crystal plane of {10$\bar{1}$0} and {11$\bar{2}$0} families of planes, and the top surface of each convex structure is any crystal plane of {1$\bar{1}$02}, {11$\bar{2}$3}, {10$\bar{1}$0} and {11$\bar{2}$1} families of planes, so as to allow the semiconductor structure to be suitable for fabricating the light emitting layer of the active region of the LED epitaxial wafer.

With a semiconductor structure according to an embodiment of the present disclosure, by introducing a plurality of discrete planes (i.e., the top surface of each convex structure) on a substrate which are at a determinate angle to the original surface of the substrate and are suitable for epitaxial growth in subsequent processes, a high-quality film is easily obtained by epitaxially growing on the plurality of discrete planes, thus reducing a dislocation density of an epitaxial layer. During the epitaxial process, by process controlling, the surface plane of the epitaxial film may be gradually changed from being parallel to the top surface of each convex structure to being parallel to the original surface of the substrate, which means that the surface of the epitaxial film may be non-polar or semi-polar even if the growth plane is polar. Furthermore, because a surface of the film formed after the epitaxial growth may be non-polar or semi-polar, by fabricating a non-polar or semi-polar LED device on the semiconductor structure, a quantum efficiency of the light emitting layer of the active region of the LED epitaxial wafer may be greatly raised, thus raising a light emitting efficiency of the LED device greatly. In addition, with the method for forming the semiconductor structure according to an embodiment of the present disclosure, the plurality of discrete planes are obtained by transferring a special patterned structure onto a mask of the substrate via the nanoimprint lithography process and then pattern-preserving etching. Moreover, arbitrary required crystal plane surface may be substantially obtained on any orientation substrate by using the method according to embodiments of the present disclosure.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
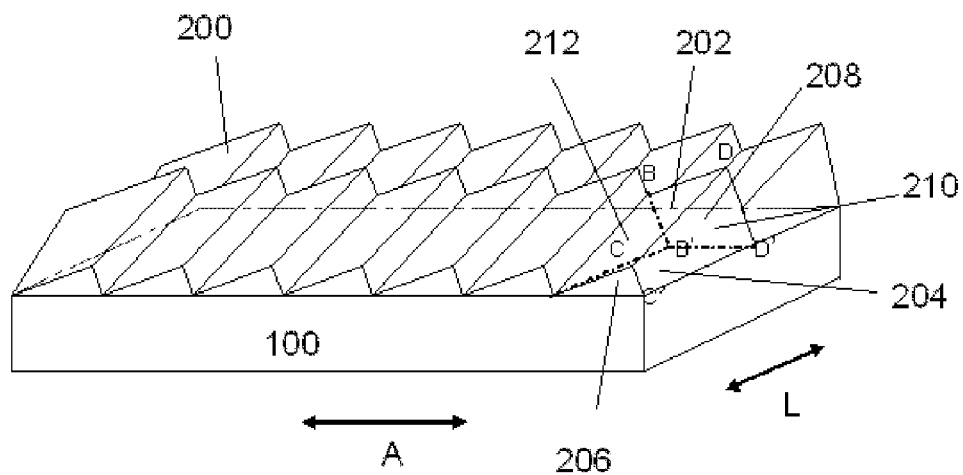
FIG. 1 is a schematic perspective view of a semiconductor structure according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operated in a particular orientation.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

With a semiconductor structure having a plurality of three-dimensional convex structures according to an embodiment of the present disclosure, by introducing a plurality of discrete planes on a substrate, which are at a determinate angle to an original surface of the substrate and are arranged in an array and are suitable for epitaxial growth in subsequent processes, such as (0001) plane of sapphire or (111) plane of silicon, a high-quality film is easily obtained by epitaxially growing on the plurality of discrete planes. A compound semiconductor material layer with required orientation is formed on the discrete planes by epitaxial growth, which may have a non-polar or semi-polar surface identical with the original surface of the substrate. By fabricating a non-polar or semi-polar LED device on the semiconductor structure, a quantum efficiency of the light emitting layer of the active region of a LED epitaxial wafer may be greatly raised, thus raising a light emitting efficiency of the LED device greatly.

FIG. 1 is a schematic perspective view of a semiconductor structure according to an embodiment of the present disclosure. As shown in FIG. 1, the semiconductor structure comprises: a substrate 100 and a plurality of convex structures 200 formed on a surface of the substrate 100. The plurality of convex structures 200 are arranged in a longitudinal direction A of the substrate 100. Each convex structure 200 has a top surface 202, a bottom surface 204 located on the surface of the substrate 100, a first end surface 206 and a second end surface 208 parallel to each other, and a front side surface 210 and a rear side surface 212 parallel to each other. As shown in FIG. 1, each of the first end surface 206 and the rear side surface 212 of each convex structure 200 has a shape of a triangle, each of the second end surface 208 and the front side surface 210 of each convex structure 200 has a shape of a trapezium, each of the top surface 202 and the bottom surface 204 of each convex structure 200 has a shape of a quadrangle, each of an intersection line BB' between the second end surface 208 and the rear side surface 212 of each convex structure 200 and an intersection line CC' between the first end surface 206 and the front side surface 210 of the each convex structure 200 is shorter than an intersection line DD' between the second end surface 208 and the front side surface 210 of the each convex structure 200. Top surfaces 202 of the plurality of convex structures 200 are parallel to each other, front side surfaces 210 of the plurality of convex structures 200 are parallel to each other, and the rear side surface 212 of one of two adjacent convex structures 200 and the front side surface 210 of the other are located on a same plane to allow the plurality of convex structures 200 to form a zigzag structure on the surface of the substrate 100.

In one embodiment, the top surface 202 of each convex structure 200 is the discrete plane for growing a compound semiconductor material (growth plane), and the front side surface 210 of each convex structure 200 is covered by a mask material (not shown in FIG. 1) to prevent the compound semiconductor material from being grown on the front side surface 210. It can be seen from FIG. 1 that, the present disclosure provides a convex structure, which has a plurality of discrete planes (such as the top surface 202 of each convex structure 200) which are at a determinate angle to the surface of the substrate and are arranged in an array and are also growth planes for growing compound semiconductor materials, and a plurality of other unnecessary surfaces that may be covered by masks (such as the front side surface 210 of each convex structure 200).

In one embodiment, as shown in FIG. 1, the plurality of convex structures 200 comprise a plurality of first convex structures and a plurality of second convex structures. The plurality of first convex structures are arranged into a first row in the longitudinal direction A of the substrate 100, and the plurality of second convex structures are arranged into a second row in the longitudinal direction A of the substrate 100. Each second convex structure corresponds to each first convex structure in a transverse direction L of the substrate 100, and the first end surface 206 of each second convex structure and the second end surface 208 of a corresponding first convex structure are located on a same plane. Furthermore, the plurality of first convex structures and the plurality of second convex structures may be arranged into a two-dimensional array on the surface of the substrate 100.

In one embodiment, materials of each convex structure 200 and the substrate 100 may be identical, such as silicon or sapphire.

In one embodiment, each convex structure 200 has a porous structure, and at least one of the top surface 202 and the front side surface 210 of each convex structure 200 is a plane formed by annealing in an atmosphere containing hydrogen.

Figure 2:
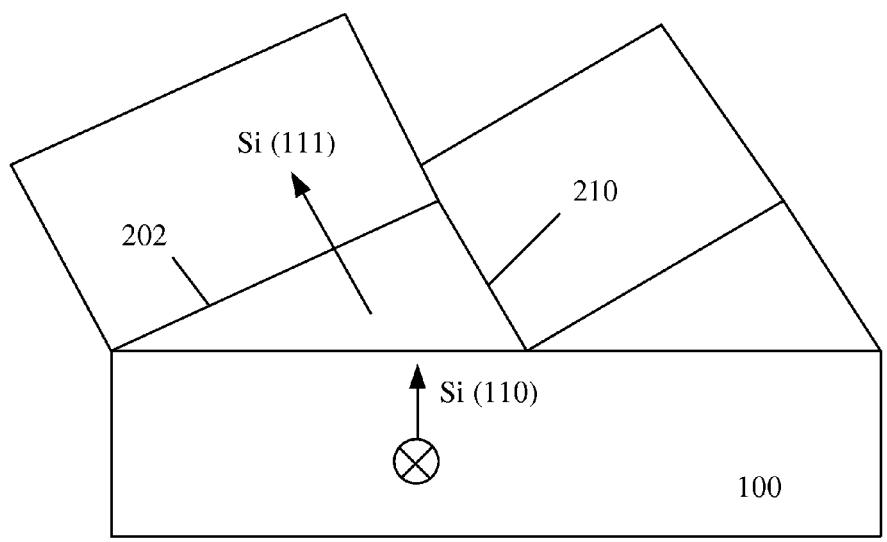
FIG. 2 is a cross-sectional view of a semiconductor structure having a silicon substrate according to an embodiment of the present disclosure.
Figure 3:
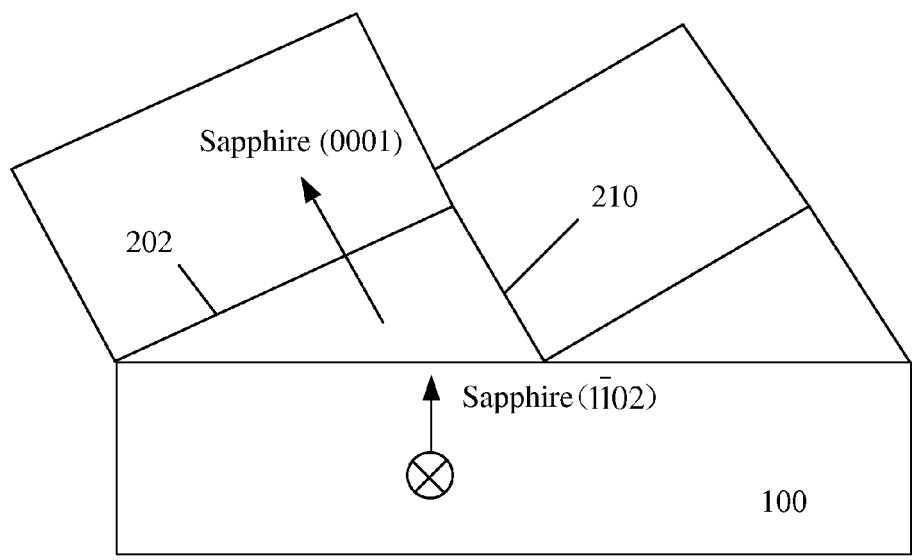
FIG. 3 is a cross-sectional view of a semiconductor structure having a sapphire substrate according to an embodiment of the present disclosure.

In one embodiment, the semiconductor structure is preferably used for forming a light emitting layer of an active region of a LED epitaxial wafer. Therefore, the substrate 100 may be a silicon substrate, and the surface of the substrate 100 may be any crystal plane of {110}, {111}, {001}, {211}, {311}, {337} and {5 5 12} families of planes, while the top surface 202 of each convex structure 200 may be any crystal plane of {111} and {110} families of planes, one of which is shown in FIG. 2. In another embodiment, the substrate 100 may be preferably a sapphire substrate; and the surface of the substrate 100 may be any crystal plane of {1$\bar{1}$02}, {11$\bar{2}$3}, {10$\bar{1}$0} and {11$\bar{2}$1} families of planes, while the top surface 202 of each convex structure 200 may be a crystal plane (0001); or the surface of the substrate 100 may be any crystal plane of {10$\bar{1}$0} and {11$\bar{2}$0} families of planes (i.e., m-plane and a-plane), while the top surface 202 of each convex structure 200 may be any crystal plane of {1$\bar{1}$02}, {11$\bar{2}$3}, {10$\bar{1}$0} and {11$\bar{2}$1} families of planes, one of which is shown in FIG. 3. The compound semiconductor material formed on the top surface 202 of each convex structure 200 may be GaN with a non-polar or semi-polar surface, such as m-plane, a-plane, or r-plane, even if the growth plane is polar (c-plane).

Methods for forming the semiconductor structure according to embodiments of the present disclosure are further provided, which comprise steps of transferring a patterned structure of a special shape onto a mask of the substrate via the nanoimprint lithography process and then pattern-preserving etching to obtain the required plurality of discrete planes. Any required crystal plane may be substantially obtained on arbitrary orientation substrate by using the method according to the embodiments of the present disclosure. The nanoimprint lithography process may be implemented via a photosensitive or thermosensitive or thermoplastic material, which may be described below respectively.

Figure 4:
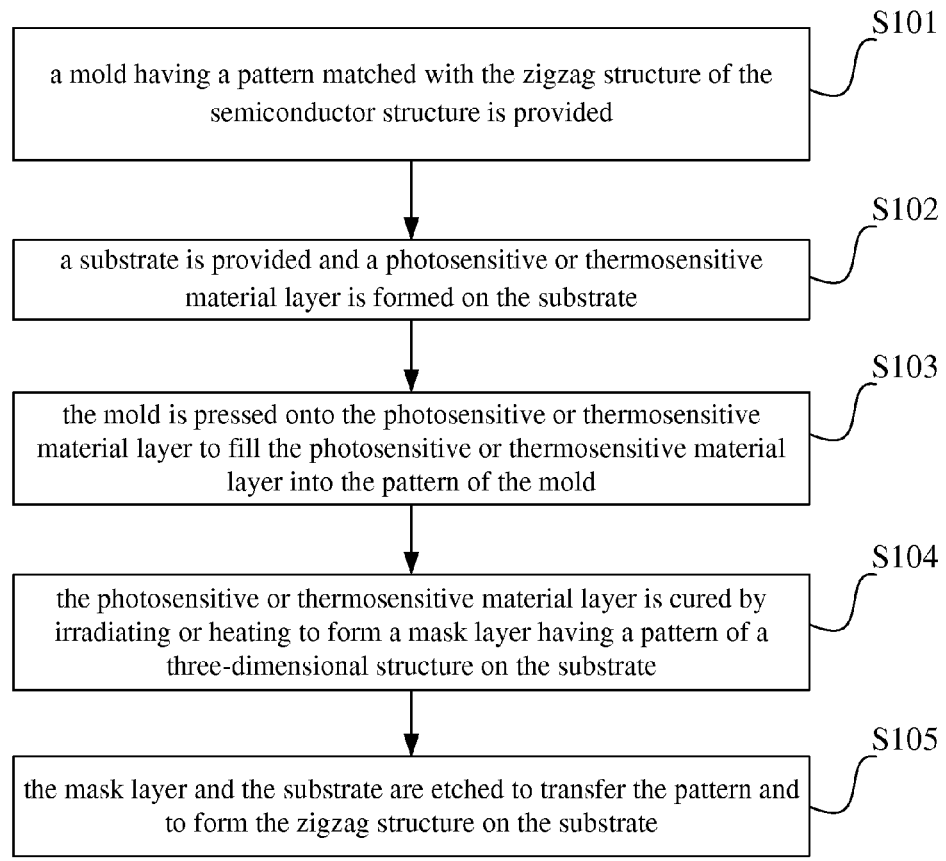
FIG. 4 is a flow chart of one method for forming a semiconductor structure according to an embodiment of the present disclosure.

FIG. 4 is a flow chart of one method for forming the semiconductor structure according to an embodiment of the present disclosure. The method comprises following steps.

Step S101: a mold having a pattern matched with the zigzag structure of the semiconductor structure is provided.

Step S102: a substrate is provided and a photosensitive or thermosensitive material layer is formed on the substrate. In one embodiment, the semiconductor structure is preferably used for forming a light emitting layer of an active region of a LED epitaxial wafer. Therefore, the substrate 100 may be a silicon substrate or a sapphire substrate, the surface of the silicon substrate may be any crystal plane of {110}, {111}, {001}, {211}, {311}, {337} and {5 5 12} families of planes; and the surface of the sapphire substrate may be any crystal plane of {1$\bar{1}$02}, {11$\bar{2}$3}, {10$\bar{1}$0} and {11$\bar{2}$1} families of planes, or any crystal plane of {10$\bar{1}$0} and {11$\bar{2}$0} families of planes (i.e., m-plane and a-plane).

Step S103: the mold is pressed onto the photosensitive or thermosensitive material layer to fill the photosensitive or thermosensitive material layer into the pattern of the mold.

Step S104: the photosensitive or thermosensitive material layer is cured by irradiating or heating to form a mask layer having a pattern of a three-dimensional structure on the substrate.

Step S105: the mask layer and the substrate are etched to transfer the pattern and to form the zigzag structure on the substrate. An etching method may be a dry etching or a wet etching. During the etching process, the pattern of the mask layer is preserved and transferred to the surface of the substrate to form the required zigzag convex structure on the surface of the substrate finally.

Figure 5:
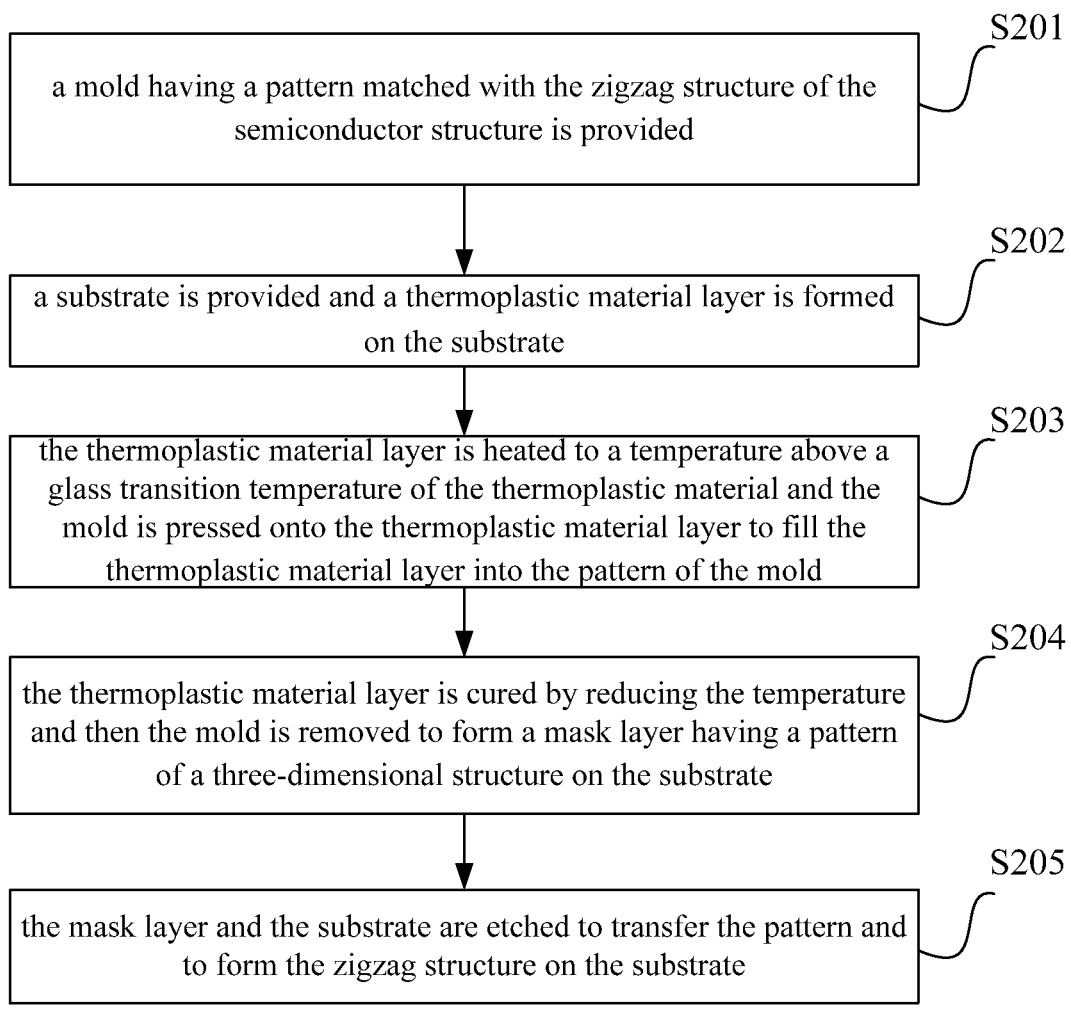
FIG. 5 is a flow chart of another method for forming a semiconductor structure according to an embodiment of the present disclosure.

FIG. 5 is a process flow chart of another method for forming the semiconductor structure according to an embodiment of the present disclosure. The method comprises following steps.

Step S201: a mold having a pattern matched with the zigzag structure of the semiconductor structure is provided.

Step S202: a substrate is provided and a thermoplastic material layer is formed on the substrate. In one embodiment, the semiconductor structure is preferably used for forming a light emitting layer of an active region of a LED epitaxial wafer. Therefore, the substrate 100 may be a silicon substrate or a sapphire substrate, the surface of the silicon substrate may be any crystal plane of {110}, {111}, {001}, {211}, {311}, {337} and {5 5 12} families of planes; and the surface of the sapphire substrate may be any crystal plane of {1$\bar{1}$02}, {11$\bar{2}$3}, {10$\bar{1}$0} and {11$\bar{2}$1} families of planes, or any crystal plane of {10$\bar{1}$0} and {11$\bar{2}$0} families of planes (i.e., m-plane and a-plane).

Step S203: the thermoplastic material layer is heated to a temperature above a glass transition temperature of the thermoplastic material and the mold is pressed onto the thermoplastic material layer to fill the thermoplastic material layer into the pattern of the mold.

Step S204: the thermoplastic material layer is cured by reducing the temperature and then the mold is removed to form a mask layer having a pattern of a three-dimensional structure on the substrate.

Step S205: the mask layer and the substrate are etched to transfer the pattern and to form the zigzag structure on the substrate. An etching method may be a dry etching or a wet etching. During the etching process, the pattern of the mask layer is preserved and transferred to the surface of the substrate to form the required zigzag convex structure on the surface of the substrate finally.

In some embodiments, by using any of the two methods, a plurality of zigzag structures arranged in a two-dimensional array may be formed on the surface of the substrate. After forming the plurality of zigzag structures, both methods may further comprise: anodizing each convex structure to form the porous structure; and annealing the porous structure in the atmosphere containing hydrogen to form a plane on the top surface and/or the front side surface of each convex structure.

In some embodiments, by using any of the two methods, after forming the plurality of zigzag structures, both methods further comprises: covering a mask material on an unnecessary part of each convex structure surface of each zigzag structure; and making a necessary top surface of each convex structure of each zigzag structure as a growth plane and growing a compound semiconductor material on each growth plane. In addition, as mentioned above, in one embodiment, the semiconductor structure is preferably used for forming a light emitting layer of an active region of a LED epitaxial wafer. Therefore, in one embodiment, when the substrate is a silicon substrate and the surface of the silicon substrate is any crystal plane of {110}, {111}, {001}, {211}, {311}, {337} and {5 5 12} families of planes, the top surface of each convex structure may be any crystal plane of {111} and {110} families of planes. In another embodiment, when the substrate is a sapphire substrate and the surface of the sapphire substrate is any crystal plane of {1$\bar{1}$02}, {11$\bar{2}$3}, {10$\bar{1}$0} and {11$\bar{2}$1} families of planes, the top surface of each convex structure may be a crystal plane (0001); or when the surface of the sapphire substrate is any crystal plane of {10$\bar{1}$0} and {11$\bar{2}$0} families of planes (i.e., m-plane and a-plane), the top surface of each convex structure may be any crystal plane of $\{1\bar{1}02\}$, $\{11\bar{2}3\}$, $\{10\bar{1}0\}$ and $\{11\bar{2}1\}$ families of planes. A high-quality film may be formed on the top surface of each convex structure by epitaxial growth. During the epitaxial process, by process controlling, the surface plane of the epitaxial film may be gradually changed from being parallel to the top surface of each convex structure to being parallel to the original surface of the substrate, which means that the surface of the epitaxial film may be non-polar or semi-polar even if the growth plane is polar. For example, even though the discrete plane (the growth plane) is parallel to the polar plane (c-plane), a non-polar or semi-polar GaN film may be formed by epitaxial growth on the convex structure if the substrate surface is parallel to non-polar plane (a-plane and m-plane) or semi-polar plane (r-plane) of GaN film.

With the semiconductor structure according to an embodiment of the present disclosure, by transferring the patterned structure of the special shape onto the mask of the substrate via the nanoimprint lithography process, and then pattern-preserving etching, the plurality of discrete planes at a determinate angle to the original surface of the substrate are introduced on the substrate. Furthermore, a compound semiconductor crystal film is formed on the needed discrete planes by an epitaxial growth process. By process controlling, the compound semiconductor crystal film may be parallel to the original surface of the substrate and be non-polar or semi-polar. By fabricating the non-polar or semi-polar LED device on the semiconductor structure, the quantum efficiency of the light emitting layer of the active region may be greatly raised, thus raising the light emitting efficiency of the LED device greatly. In addition, any required crystal plane may be substantially obtained on arbitrary orientation substrate by using the method according to embodiments of the present disclosure.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A semiconductor structure, comprising:
   a substrate; and
   a plurality of convex structures formed on a surface of the substrate and arranged in a longitudinal direction of the substrate, each convex structure having a top surface, a bottom surface located on the surface of the substrate, a first end surface and a second end surface parallel to each other, and a front side surface and a rear side surface parallel to each other;
   wherein each of the first end surface and the rear side surface of each convex structure has a shape of a triangle, each of the second end surface and the front side surface of each convex structure has a shape of a trapezium, each of the top surface and the bottom surface of each convex structure has a shape of a quadrangle, each of an intersection line between the second end surface and the rear side surface of each convex structure and an intersection line between the first end surface and the front side surface of the each convex structure is shorter than an intersection line between the second end surface and the front side surface of the each convex structure, top surfaces of the plurality of convex structures are parallel to each other, front side surfaces of the plurality of convex structures are parallel to each other, and the rear side surface of one of two adjacent convex structures and the front side surface of the other are located on a same plane to allow the plurality of convex structures to form a zigzag structure on the surface of the substrate.

2. The semiconductor structure according to claim 1, wherein the plurality of convex structures comprise a plurality of first convex structures and a plurality of second convex structures, the plurality of first convex structures and the plurality of second convex structures are arranged into a first row and a second row in the longitudinal direction of the substrate respectively, each second convex structure corresponds to each first convex structure in a transverse direction of the substrate, and the first end surface of each second convex structure and the second end surface of a corresponding first convex structure are located on a same plane.

3. The semiconductor structure according to claim 1, wherein materials of each convex structure and the substrate are identical.

4. The semiconductor structure according to claim 1, wherein each convex structure has a porous structure.

5. The semiconductor structure according to claim 4, wherein the top surface and/or the front side surface of each convex structure are a plane formed by annealing in an atmosphere containing hydrogen.

6. The semiconductor structure according to claim 1, wherein each convex structure is formed by a nanoimprint lithography process.

7. The semiconductor structure according to claim 1, wherein the substrate is a silicon substrate; the surface of the substrate is any crystal plane of $\{110\}$, $\{111\}$, $\{001\}$, $\{211\}$, $\{311\}$, $\{337\}$ and $\{5\ 5\ 12\}$ families of planes; and the top surface of each convex structure is any crystal plane of $\{111\}$ and $\{110\}$ families of planes.

8. The semiconductor structure according to claim 1, wherein the substrate is a sapphire substrate; and
   the surface of the substrate is any crystal plane of $\{1\bar{1}02\}$, $\{11\bar{2}3\}$, $\{10\bar{1}0\}$ and $\{11\bar{2}1\}$ families of planes, and the top surface of each convex structure is a crystal plane (0001); or
   the surface of the substrate is any crystal plane of $\{10\bar{1}0\}$ and $\{11\bar{2}0\}$ families of planes, and the top surface of each convex structure is any crystal plane of $\{1\bar{1}02\}$, $\{11\bar{2}3\}$, $\{10\bar{1}0\}$ and $\{11\bar{2}1\}$ families of planes.

9. A method for forming a semiconductor structure, said method comprising:
   providing a mold having a pattern matched with a zigzag structure of the semiconductor structure, wherein the zigzag structure comprises a plurality of convex structures arranged in a longitudinal direction, each convex structure has a top surface, a bottom surface, a first end surface and a second end surface parallel to each other, and a front side surface and a rear side surface parallel to each other, each of the first end surface and the rear side surface of each convex structure has a shape of a triangle, each of the second end surface and the front side surface of each convex structure has a shape of a trapezium, each of the top surface and the bottom surface of each convex structure has a shape of a quadrangle, each of an intersection line between the second end surface and the rear side surface of each convex structure and an intersection line between the first end surface and the front side surface of the each convex structure is shorter than an intersection line between the second end surface and the front side surface of the each convex structure, top surfaces of the plurality of convex structures are parallel to each other, front side surfaces of the plurality of convex structures are parallel to each other, and the rear side surface of one of two adjacent convex structures and the front side surface of the other are located on a same plane;

providing a substrate and forming a photosensitive or thermosensitive material layer on the substrate;

pressing the mold onto the photosensitive or thermosensitive material layer to fill the photosensitive or thermosensitive material layer into the pattern of the mold;

curing the photosensitive or thermosensitive material layer by irradiating or heating to form a patterned mask layer on the substrate; and etching the patterned mask layer and the substrate to transfer the pattern and to form the zigzag structure on the substrate.

10. The method for forming a semiconductor structure according to claim 9, after forming the zigzag structure, further comprising:

anodizing each convex structure to form a porous structure; and annealing the porous structure in an atmosphere containing hydrogen to form a plane on the top surface and/or the front side surface of each convex structure.

11. The method for forming a semiconductor structure according to claim 9, wherein the substrate is a silicon substrate; the surface of the substrate is any crystal plane of $\{110\}$, $\{111\}$, $\{001\}$, $\{211\}$, $\{311\}$, $\{337\}$ and $\{5\ 5\ 12\}$ families of planes; and the top surface of each convex structure is any crystal plane of $\{111\}$ and $\{110\}$ families of planes.

12. The method for forming a semiconductor structure according to claim 9, wherein the substrate is a sapphire substrate; and the surface of the substrate is any crystal plane of $\{1\bar{1}02\}$, $\{11\bar{2}3\}$, $\{10\bar{1}0\}$ and $\{11\bar{2}1\}$ families of planes, and the top surface of each convex structure is a crystal plane (0001); or the surface of the substrate is any crystal plane of $\{10\bar{1}0\}$, and $\{11\bar{2}0\}$ families of planes, and the top surface of each convex structure is any crystal plane of $\{1\bar{1}02\}$, $\{11\bar{2}3\}$, $\{10\bar{1}0\}$ and $\{11\bar{2}1\}$ families of planes.

13. A method for forming a semiconductor structure, said method comprising:

providing a mold having a pattern matched with a zigzag structure of the semiconductor structure, wherein the zigzag structure comprises a plurality of convex structures arranged in a longitudinal direction, each convex structure has a top surface, a bottom surface, a first end surface and a second end surface parallel to each other, and a front side surface and a rear side surface parallel to each other, each of the first end surface and the rear side surface of each convex structure has a shape of a triangle, each of the second end surface and the front side surface of each convex structure has a shape of a trapezium, each of the top surface and the bottom surface of each convex structure has a shape of a quadrangle, each of an intersection line between the second end surface and the rear side surface of each convex structure and an intersection line between the first end surface and the front side surface of the each convex structure is shorter than an intersection line between the second end surface and the front side surface of the each convex structure, top surfaces of the plurality of convex structures are parallel to each other, front side surfaces of the plurality of convex structures are parallel to each other, and the rear side surface of one of two adjacent convex structures and the front side surface of the other are located on a same plane;

providing a substrate and forming a thermoplastic material layer on the substrate;

heating the thermoplastic material layer to a temperature above a glass transition temperature of the thermoplastic material, and pressing the mold onto the thermoplastic material layer to fill the thermoplastic material layer into the pattern of the mold;

curing the thermoplastic material layer by reducing the temperature and then removing the mold to form a patterned mask layer on the substrate; and etching the patterned mask layer and the substrate to transfer the pattern and to form the zigzag structure on the substrate.

14. The method for forming a semiconductor structure according to claim 13, after forming the zigzag structure, further comprising:

anodizing each convex structure to form a porous structure; and annealing the porous structure in an atmosphere containing hydrogen to form a plane on the top surface and/or the front side surface of each convex structure.

15. The method for forming a semiconductor structure according to claim 13, wherein the substrate is a silicon substrate; the surface of the substrate is any crystal plane of $\{110\}$, $\{111\}$, $\{001\}$, $\{211\}$, $\{311\}$, $\{337\}$ and $\{5\ 5\ 12\}$ families of planes; and the top surface of each convex structure is any crystal plane of $\{111\}$ and $\{110\}$ families of planes.

16. The method for forming a semiconductor structure according to claim 13, wherein the substrate is a sapphire substrate; and the surface of the substrate is any crystal plane of $\{1\bar{1}02\}$, $\{11\bar{2}3\}$, $\{10\bar{1}0\}$ and $\{11\bar{2}1\}$ families of planes, and the top surface of each convex structure is a crystal plane (0001); or the surface of the substrate is any crystal plane of $\{10\bar{1}0\}$ and $\{11\bar{2}0\}$ families of planes, and the top surface of each convex structure is any crystal plane of $\{1\bar{1}02\}$, $\{11\bar{2}3\}$, $\{10\bar{1}0\}$ and $\{11\bar{2}1\}$ families of planes.

17. The method for forming a semiconductor structure according to claim 9, wherein the plurality of convex structures comprise a plurality of first convex structures and a plurality of second convex structures, the plurality of first convex structures and the plurality of second convex structures are arranged into a first row and a second row in the longitudinal direction of the substrate respectively, each second convex structure corresponds to each first convex structure in a transverse direction of the substrate, and the first end surface of each second convex structure and the second end surface of a corresponding first convex structure are located on a same plane.

18. The method for forming a semiconductor structure according to claim 9, wherein materials of each convex structure and the substrate are identical.

19. The method for forming a semiconductor structure according to claim 13, wherein the plurality of convex structures comprise a plurality of first convex structures and a plurality of second convex structures, the plurality of first convex structures and the plurality of second convex structures are arranged into a first row and a second row in the longitudinal direction of the substrate respectively, each second convex structure corresponds to each first convex structure in a transverse direction of the substrate, and the first end surface of each second convex structure and the second end surface of a corresponding first convex structure are located on a same plane.

20. The method for forming a semiconductor structure according to claim 13, wherein materials of each convex structure and the substrate are identical.

* * * * *